United States Patent [19]

Ishihara

[11] Patent Number: 4,531,236
[45] Date of Patent: Jul. 23, 1985

[54] MICROWAVE INTEGRATED CIRCUIT FREQUENCY CONVERTER

[75] Inventor: Hiroyuki Ishihara, Tokyo, Japan

[73] Assignee: Nippon Electric Co., Ltd., Tokyo, Japan

[21] Appl. No.: 447,826

[22] Filed: Dec. 8, 1982

[30] Foreign Application Priority Data

Dec. 11, 1981 [JP] Japan ............................ 56-200511

[51] Int. Cl.³ .......................... H04B 1/10; H04B 1/26
[52] U.S. Cl. .................................. 455/302; 455/317; 455/327; 455/330
[58] Field of Search ............... 455/302, 317, 325–328, 455/330

[56] References Cited

U.S. PATENT DOCUMENTS 4,211,977  7/1980  Shinkawa et al. .................. 455/326
4,412,351  10/1983  Onishi et al. ........................ 455/327

FOREIGN PATENT DOCUMENTS 35412  4/1978  Japan .................................. 455/330

*Primary Examiner*—Jin F. Ng

*Attorney, Agent, or Firm*—Sughrue, Mion, Zinn, Macpeak, and Seas

[57] ABSTRACT

A microwave integrated circuit frequency converter includes a first filter (30) for a signal frequency and a second filter (32) for a local oscillator frequency connected at one terminal thereof with one terminal of the signal frequency filter (30) by a line (38), (40) having a predetermined electrical length. A parallel stub line (42) is short-circuited at one end thereof. A diode (34) is connected at its one end to a third filter (36) which is adapted to reflect the signal and local oscillator frequencies while passing an intermediate frequency. The diode (34) is connected at the other end to a line (41). The parallel stub line (42) and line (41) are connected at their other ends to a specific junction P on the connecting line (38), (40) at which the impedance is open circuited for the signal frequency when the local oscillator frequency filter (32) is seen from the signal frequency filter (30) side and the impedance is open circuited for the local oscillator frequency when the signal frequency filter (30) is seen from the local oscillator frequency filter (32) side.

2 Claims, 7 Drawing Figures

MICROWAVE INTEGRATED CIRCUIT FREQUENCY CONVERTER

BACKGROUND OF THE INVENTION

The present invention relates to a microwave integrated circuit (MIC) frequency converter and, more particularly, to an image reflection type MIC frequency converter which is low in conversion loss and excellent in frequency characteristics.

In a prior art frequency converter or mixer of the present type, an input signal is fed through a bandpass filter and a transmission line having a predetermined electrical length to a junction. A local oscillator signal is fed through a similar bandpass filter and transmission line to the junction. A diode which is short circuited at one end is connected at its other end to the junction. The junction is also connected through a low pass filter to an output terminal at which the output in the form of an intermediate frequency appears.

In these types of converters, since the signal and local oscillator impedances are matched to the diode by the transmission lines for the input signal and local oscillator signal, respectively, it is difficult or impossible to optimally terminate an image frequency in such a manner as to provide minimum conversion loss.

SUMMARY OF THE INVENTION

A microwave integrated circuit frequency converter embodying the present invention includes a first filter having an input connected to receive an input signal at a selected frequency, a second filter having an input connected to receive a signal at a local oscillator frequency, and a third filter for passing an intermediate frequency signal and reflecting the input signal, the local oscillator signal and a signal at the image frequency. The converter further includes a first transmission line connecting an output of the first filter to a junction, a second transmission line connecting an output of the second filter to the junction, and a third transmission line connecting the third filter to the junction. A diode is coupled between the third transmission line and an input of the third filter. A parallel stub line is at one end short-circuited and at another end connected to the junction. The electrical lengths of the first and second transmission lines and the parallel stub line are selected so that an impedance seem from the junction is open-circuited to the input signal frequency and the local oscillator frequency. The electrical length of the third transmission line is selected so that an impedance seen from the diode is open- or short-circuited for the image frequency.

It is an object of the present invention to provide a microwave integrating circuit frequency converter which achieves excellent conversion loss and frequency characteristics by open-circuiting or short-circuiting the impedance for the image frequency.

It is another object of the present invention to provide a generally improved microwave integrated circuit frequency converter.

Other objects, together with the foregoing, are attained in the embodiments described in the following description and illustrated in the accompanying drawings.

DESCRIPTION OF THE PREFERRED EMBODIMENTS

While the microwave integrated circuit frequency converter of the present invention is susceptible of numerous physical embodiments, depending upon the environment and requirements of use, substantial numbers of the herein shown and described embodiments have been made, tested and used, and all have performed in an eminently satisfactory manner.

Figure 1:
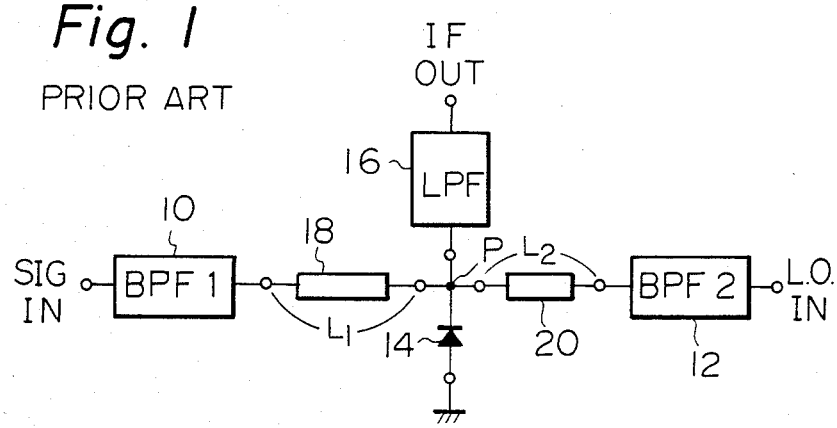
FIG. 1 is a diagram of a prior art image reflection type of frequency converter.

Referring to FIG. 1 of the drawings, a prior art MIC frequency converter is shown. The frequency converter comprises a band-pass filter 10 for a signal frequency (abbreviated as BPF 1 thereinafter), a band-pass filter 12 for a local oscillator frequency (abbreviated as BPF 2 hereinafter), a diode 14 for mixing the signal and local oscillator frequencies to produce an intermediate frequency, a low-pass filter 16 (abbreviated as LPF hereinafter) for reflecting the signal and local oscillator frequencies and passing the intermediate frequency, and transmission lines 18 and 20 each having a predetermined electrical length $L_1$ and $L_2$, respectively.

The diode 14 is driven by local oscillator power which is applied thereto via the BPF 2 with a frequency $f_{LO}$. When a signal frequency $f_S$ is fed to the diode 14 via the BFP 1, the diode 14 mixes the frequencies $f_{LO}$ and $f_S$ and outputs frequency components generally expressed as:

$$f = |nf_{LO} \pm mf_S| \qquad \text{Eq. (1)}$$

where n and m may be any integer 0, 1, 2, ...

Figure 6:
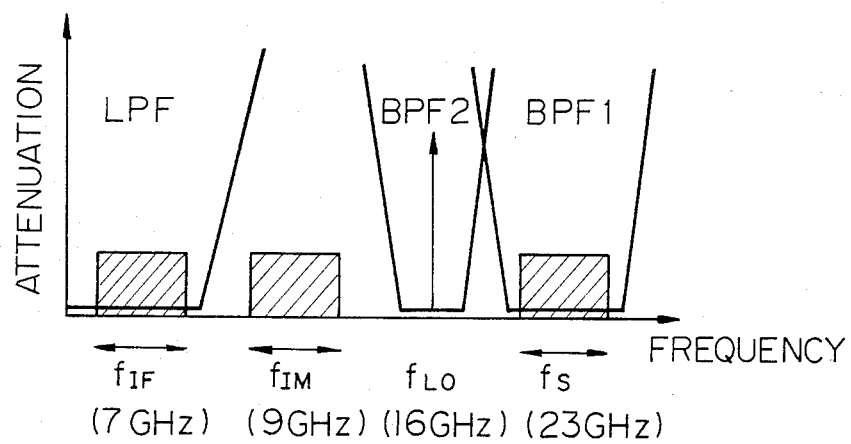
FIG. 6 is a graph showing a frequency arrangement of a frequency converter.

Of these frequency components, those having significant influence on the behavior of the frequency converter are the output signal component $f_{IF}=f_S-f_{LO}$ and the image frequency component $f_{IM}=2f_{LO}-f_S$. This applies not only to a frequency converter for reception but to a frequency converter for transmission, in which the operation is greatly effected by an output signal component $f_S=f_{LO}+f_{IF}$ and an image frequency component $f_{IM}=f_{LO}-f_{IF}$ where $f_{IF}$ is an input intermediate signal frequency. The signal frequency, local oscillator frequency, image frequency and intermediate frequency may be plotted on a frequency domain diagram as indicated in FIG. 6.

To attain an output signal component efficiently from the frequency converter, it is a primary requisite that impedance matching with the diode 14 be set up as seen from each terminal for the local oscillator frequency, signal frequency and intermediate frequency. In the frequency converter shown in FIG. 1, the impedance is open-circuited for the input signal frequency and local oscillator frequency and matched with the intermediate frequency when the LPF is seen from a junction P. Therefore, if the electrical length $L_1$ of the transmission line 18 is selected such that the impedance is open-circuited for the local oscillator frequency when the BPF 1 is seen from the juntion P, the local oscillator input becomes terminated at the diode 14 resulting in ease of impedance matching. Easy matching is also attainable if the electrical length $L_2$ of the transmission line 20 is selected such that the impedance is open-circuited for the signal frequency $f_S$ when the BPF 2 is seen from junction P, causing the signal input to terminate at the diode 14. So selecting the electrical lengths of the transmission lines 18 and 20 allows impedance matching to be readily obtained with the signal frequency and local oscillator frequency.

However, concerning a diode of the type driven by local oscillator power and supplied with input signal power, desirable conversion loss and frequency characteristics cannot be accomplished unless the produced image frequency is open- or short-circuited as seen from the diode side. The prior art frequency converter shown in FIG. 1 is incapable of permitting the impedance to be open-circuited or short-circuited for the image frequency, because the electric lengths $L_1$ and $L_2$ of the transmission lines 18 and 20 are respectively determined by the matching conditions with the local oscillator frequency and signal frequency. This degrades the conversion loss and frequency characteristics of the frequency converter.

Figure 2:
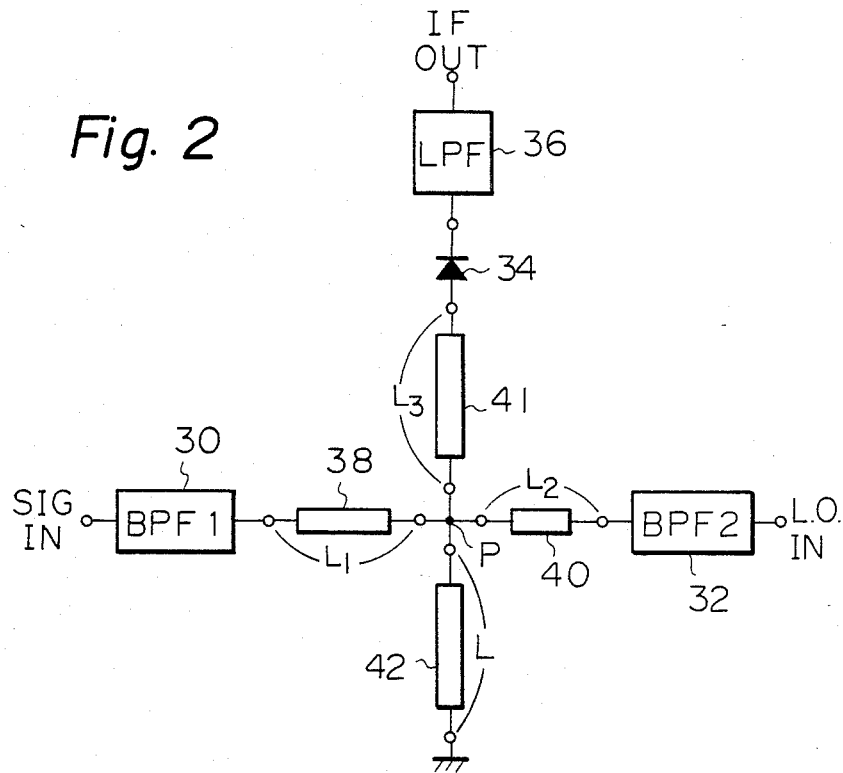
FIG. 2 is a diagram of a microwave integrated circuit frequency converter embodying the present invention.

Referring to FIG. 2 of the drawings, a frequency converter of the present invention includes a band-pass filter 30 for an input signal at a given frequency, a band-pass filter 32 for a local oscillator frequency, a diode 34, a low-pass filter 36, transmission lines 38, 40 and 41 each having a predetermined electrical length $L_1$, $L_2$, and $L_3$, respectively and a parallel stub line 42, one end of which is short-circuited. The impedance of the low-pass filter 36, as seen from the diode side, is short-circuited for a signal at the input frequency and a local oscillator frequency while being short-circuited or open-circuited for an image frequency. As in the case of FIG. 1, impedance matching with the input signal frequency and local oscillator frequency can be readily achieved if the transmission lines 38 and 40 are selected as in FIG. 1 and the parallel stub line 42 is provided with a length which opens the impedance of the stub line for signals at the input signal and local oscillator frequencies. Supposing that the length of the parallel stub line 42 is L, a condition for opening the parallel stub line 42 for the signal frequency is obtained as:

$$L = (2n-1)/4 \cdot \lambda_S \qquad \text{Eq. (2)}$$

where n is an integer and $\lambda_S$ the wavelength of the signal frequency. The parallel stub line 42 is substantially open-circuited for the local oscillator frequency as well, because the local oscillator frequency is generally close to the signal frequency.

Generally, the intermediate frequency has a value which is substantially lower than the values of the local oscillator frequency and image frequency. Therefore, the electrical length L of the parallel stub line 42 is negligibly small for the intermediate frequency. It follows that the junction P in FIG. 2 can be substantially regarded as a ground point for the intermediate frequency.

The impedance seen from the diode toward the junction can be arbitrarily controlled by selecting the electrical length $L_3$ of the transmission line 41. Thus, the produced image frequency can be open or short-circuited as seen from the diode.

Again the line 41 is short enough to be negligible for the intermediate frequency.

To summarize the description so far made, where the frequency converter shown in FIG. 2 is seen from each of the signal, local oscillator and intermediate frequency terminals, all the inputs are terminated only at the diode 34 at their own frequencies. The impedance can be short-circuited or open-circuited for an image frequency which is generated at the diode 34.

Figure 3:
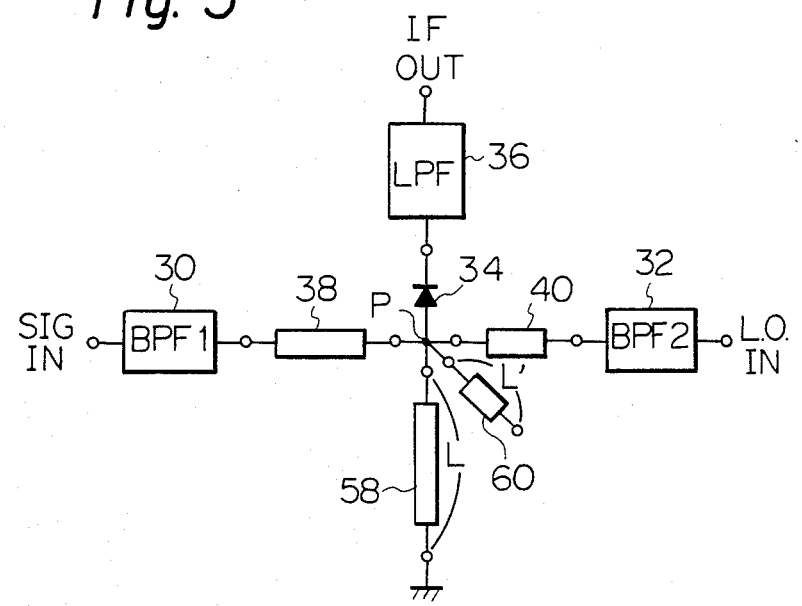
FIG. 3 is a diagram showing another embodiment of the present invention.

Referring to FIG. 3, another embodiment of the present invention is shown which is essentially similar to the embodiment of FIG. 2 except for the provision of an additional parallel stub line 60 which is open at one end thereof and provided with a length L'. The frequency converter shown in FIG. 3 operates in the same manner as the one shown in FIG. 2.

Figure 4:
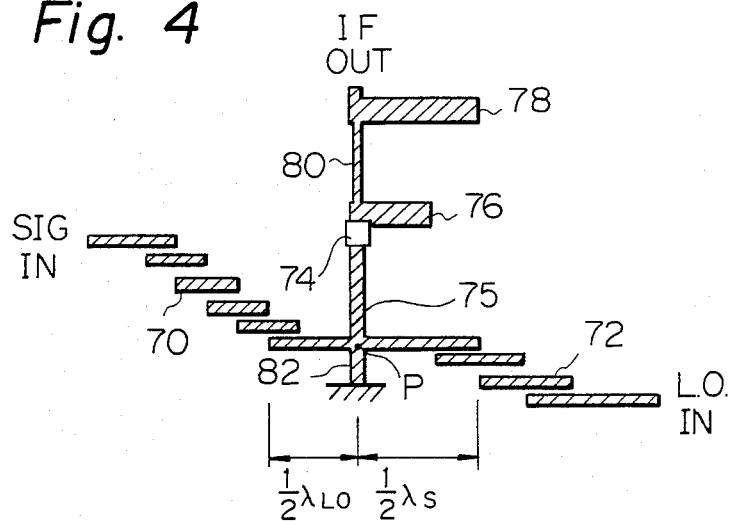
FIGS. 4 and 5 are views of practical arrangement of the microwave integrated circuit frequency converters shown in FIGS. 2 and 3, respectively.

Referring to FIG. 4, a practical example of the frequency converter shown in FIG. 2 is illustrated in which the signal frequency is 23 GHz, the local oscillator frequency is 16 GHz and the intermediate frequency is 7 GHz.

In this frequency converter, the circuits corresponding to the BPF's 1 and 2 shown in FIG. 2 respectively comprise 4-stage and 2-stage parallel coupled lines 70 and 72. The center frequency of the line 70 is 23 GHz while that of the line 72 is 16 GHz. As shown, the distances of the lines 70 and 72 to a diode 74 are selected to be $\lambda_{LO}/2$ and $\lambda_S/2$, respectively. With such a construction, the impedance is open-circuited at 16 GHz (local oscillator frequency) when the 23 GHz BPF is seen from the diode side and is open-circuited at 23 GHz (signal frequency) when the 16 GHz BPF is seen from the diode side.

The low-pass filter LPF comprises two low impedance parallel open lines 76 having a length $\lambda_S/4$, a low impedance parallel open line 78 having a length $\lambda_{IM}/4$ and a high impedance series line 80. The low impedance parallel open line 76 short-circuits the input signal frequency 23 GHz as one end of the diode 74. The local oscillator frequency is substantially short-circuited because its frequency is approximate to that of the signal. When a length $\lambda_{IM}/2$ is selected for the high impedance series line 80, the image frequency 9 GHz is short-circuited at one end of the diode 74.

Where a parallel stub line 82 is provided with a length $\lambda_S/4$, its impedance is opened for the frequency of 23 GHz (signal) and substantially opened for the frequency of 16 GHz (local oscillator signal), as seen from the point P. As for the 7 GHz (intermediate frequency), the parallel stub line 82 substantially short-circuits at the point F inasmuch as its length is presumed to be substantially shorter than the wavelengths. The length of the transmission line 75 corresponding to 41 in FIG. 2 is selected so that the impedance seen from the diode for the image frequency is short-circuited.

By so designing the 23 GHz, 16 GHz BPF and 6 GHz LPF, a frequency converter can be realized which attains impedance matching with the signal frequency, local oscillator frequency and intermediate frequency while short-circuiting the image frequency.

Figure 5:
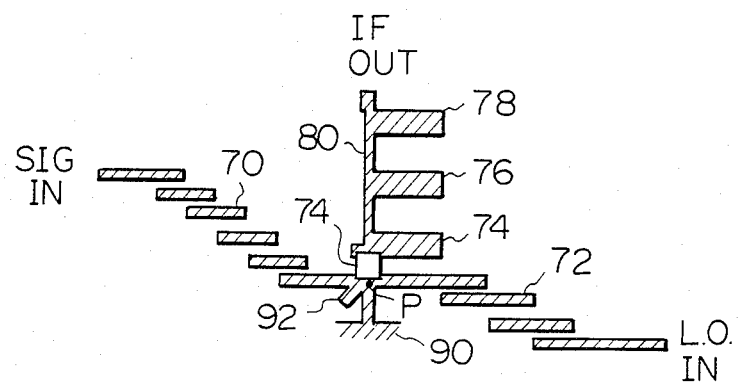

Referring to FIG. 5, a practical example of the frequency converter shown in FIG. 3 is illustrated in which a parallel stub line 90 which is short-circuited at one end and a parallel stub line 92 which is opened at one end replace the parallel stub line 32 of FIG. 4. Supposing that the parallel stub lines 90 and 92 are respectively provided with lengths L and L', selecting the sum L+L'=$\lambda_S$/4 provides a condition for open-circuiting at the point P for the signal and substantially open-circuiting for the local oscillator frequency. If the length L is sufficiently short, a short-circuiting condition for the image and intermediate frequencies can be more positively set up.

Figure 7:
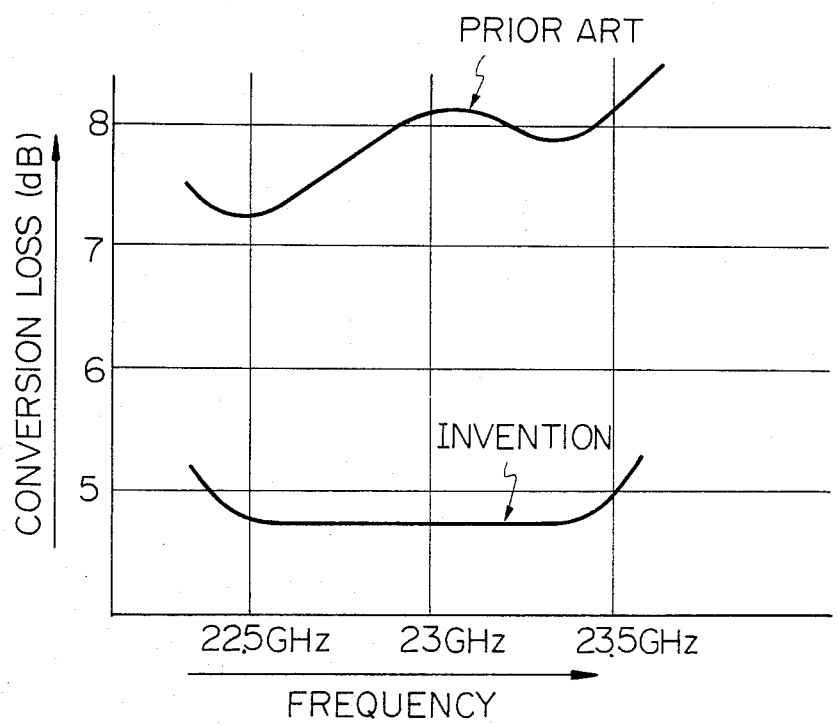
FIG. 7 is a plot indicating actually measured conversion losses of the frequency converters shown in FIGS. 1 and 3.

FIG. 7 shows curves demonstrating the superiority in conversion loss of the construction shown in FIG. 3 to the construction shown in FIG. 1. It will be apparent from the curves that the present invention is far advantageous over the prior art both in conversion loss and frequence characteristics.

In summary, it will be seen that the present invention provides a microwave integrated circuit frequency converter which has improved conversion loss and frequency characteristics due to its matching with a signal frequency and a local oscillator frequency and a condition to open or short-circuit for an image frequency. This is achievable merely by locating a suitable length of parallel stub line with one end short-circuited and a suitable length of series transmission line between the diode and the junction or combination of a parallel stub line with one end short-circuited and a parallel stub line with one end open circuited, at a point P where a bandpass filter for a signal and a band-pass filter for a local oscillator signal are connected together.

Various modifications will become possible for those skilled in the art after receiving the teachings of the present disclosure without departing from the scope thereof. For example, the principle of the present invention may be applied to a frequency converter for transmission instead of reception.

What is claimed is:

1. A microwave integrated circuit frequency converter comprising:

first bandpass filter means having an input connected to receive a signal frequency;

second bandpass filter means having an input connected to receive a local oscillator frequency;

first transmission line means connecting an output of the first bandpass filter means to a junction;

second transmission line means connecting an output of the second bandpass filter means to the junction;

low pass filter means constructed to pass an intermediate frequency and reflect the signal and local oscillator frequencies and an image frequency;

third transmission line means connecting the low pass filter means to the junction;

diode means coupled between the third transmission line means and an input of the low pass filter means; and parallel stub line means having one end short-circuited and another end connected to the junction, electrical lengths of the first and second transmission line means and the parallel stub line means being selected so that an impedance seen from the junction is open-circuited to the signal frequency and the local oscillator frequency, the electrical length of the third transmission line means being selected so that an impedance seen from the diode is open-circuited or short-circuited for the image frequency.

2. A microwave integrated circuit frequency converter comprising:

first bandpass filter means having an input connected to receive a signal frequency and passing substantially only said signal frequency;

second bandpass filter means having an input connected to receive a local oscillator frequency and passing substantially only said local oscillator frequency;

first transmission line means connecting an output of the first bandpass filter means to a junction;

second transmission line means connecting an output of the second bandpass filter means to the junction;

low pass filter means constructed to pass an intermediate frequency and reflect the signal and local oscillator frequencies and an image frequency;

diode means coupled between the junction and an input of the low pass filter means;

a first parallel stub line means having one end short-circuited and another end connected to the junction, and a second parallel stub line means having one end open-circuited and another end connected to the junction;

electrical lengths of the first and second transmission line means and the first and second parallel stub line means being selected so that an impedance seen from the junction is open-circuited to the signal frequency and the local oscillator frequency.

* * * * *